United States Patent
Wu et al.

(10) Patent No.: US 8,253,462 B2
(45) Date of Patent: Aug. 28, 2012

(54) DUTY CYCLE CORRECTION METHOD AND ITS IMPLEMENTING CIRCUIT

(75) Inventors: Guosheng Wu, Chengdu (CN); Yong Quan, Chengdu (CN)

(73) Assignee: IPGoal Microelectronics (SiChuan) Co., Ltd., High-Tech Incubation Park, Chengdu, Sichuan Province (CN)

( * ) Notice: Subject to any disclaimer, the term of this patent is extended or adjusted under 35 U.S.C. 154(b) by 62 days.

(21) Appl. No.: 12/848,982

(22) Filed: Aug. 2, 2010

(65) Prior Publication Data
US 2011/0025392 A1    Feb. 3, 2011

(30) Foreign Application Priority Data
Aug. 3, 2009   (CN) .......................... 2009 1 0060233

(51) Int. Cl.
*H03K 3/017* (2006.01)
*H03K 5/04* (2006.01)
*H03K 7/08* (2006.01)

(52) U.S. Cl. .................. 327/175; 327/157; 327/172

(58) Field of Classification Search .............. 327/157, 327/172, 175
See application file for complete search history.

(56) References Cited

U.S. PATENT DOCUMENTS
2009/0134923 A1* 5/2009 Kwong et al. ............... 327/157
* cited by examiner

*Primary Examiner* — John Poos

(57) ABSTRACT

A duty cycle correction method includes detecting independently a relative delay time of two input differential signals; equating the sum of two relative delay time with the cycle of the input differential signals; and adjusting the two delay time to the same value. A corresponding implementation circuit includes two time delay units; two relative phase detectors connecting simultaneously with each of the two time delay units; a charge pump connecting with the output of each of the two relative phase detectors, with its output connecting to the two time delay units in order to form a loop; and a synthesis output unit connecting with both the time delay units, thereby generating output signals. The adjusting range of duty cycle becomes much wider. The implementation circuit is absolutely symmetrical, so a duty cycle with high accuracy can be obtain.

20 Claims, 4 Drawing Sheets

DUTY CYCLE CORRECTION METHOD AND ITS IMPLEMENTING CIRCUIT

BACKGROUND OF THE PRESENT INVENTION

1. Field of the Invention

The present invention pertains to a duty cycle circuit, most particularly, to a duty cycle correction method and its implementing circuit which uses a relative phase detector in order to detect duty cycle errors, uses charge pumps in order to accumulate the errors and uses controllable delay units in order to adjust the duty ratio.

2. Description of Related Arts

It is very significant to adjust the duty cycle of a half-rate transmission clock. Generally, the conventional duty cycle circuit is implemented by adjusting the reverse threshold of the clock inverter or buffer. By increasing or decreasing the threshold, the pulse width of the high-level and low-level of an input clock can be changed and the duty ratio gets adjusted. The adjusting range is limited to the transition time of the clock, which is always short to reduce the signal interference (SI) effect.

As for a detecting method, the conventional way is to compare the DC levels of differential signals. However, the accuracy is easy to be influenced due to the DC offset of a comparator.

SUMMARY OF THE PRESENT INVENTION

It is the purpose of the present invention to provide a duty cycle correction method and it's implementing circuit, which adjusts the relative delay of the differential signals to obtain a rising edge or a falling edge with the same intervals, and accordingly, it will increase the adjusting range of the duty ratio. The implementing circuit is symmetrical, which can be designed with exact match to achieve a high-accuracy of duty ratio.

An object of the present invention is to provide a duty cycle correction method, comprising:

Detecting a relative delay time of input differential signals INP and INN independently, namely, relative to INN, detecting the delay time of INP, and relative to INP, detecting the delay time of INN, thereby obtaining a delay time t1 of INP relative to INN and a delay time t2 of INN relative to INP; equating the sum of t1 and t2 to the cycle of the input differential signals, that is, t1+t2=T; and adjusting t1 and t2 until the same value, that is, make a high level period and a low level period be the same long, wherein t1 and t2 corresponds to the high-level and low-level period of an input signal respectively, and is controlled by a feedback.

Since the cycle of the input signals T is determined, the changes of t1 and t2 are just the opposite. t1 and t2 corresponds to the time width of a high-level period and a low-level period of input signals cycle respectively. If the high-level period is shorter than the lower-level period, INN needs to be delayed, which means to extend the high-level period t1, until t1 be equal to t2, and then subsequent circuits can further output a signal with a duty ratio of 1:1.

The other object of the present invention is to provide a duty cycle correction circuit to implement the method described above. The circuit comprises:

two time delay units with a reverse but symmetrical control logic;

two relative phase detectors connecting simultaneously with each of the two time delay units;

a charge pump with its input connecting with the output of each of the two relative phase detectors, with its output connecting to the input of the two time delay units in order to form a loop; and a synthesis output unit connecting with both the time delay units, thereby generating output signals.

The input terminal of the two time delay units is connected to the differential signals INP and INN respectively; the output terminal of the two time delay units is connected reversely to the input terminal of the two relative phase detectors, while simultaneously connected to the input terminal of the synthesis output unit; the outputs of the two relative phase detectors are connected to the two inputs of the charge pump; the output terminal of the charge pump is connected to the input terminal of the feedback control signal of two time delay units.

The two relative phase detectors are responsible for detecting respectively the phase delay of signals on one path relative to the other path; before detecting a phase, the signals on the other path must be existing already.

The charge pump is responsible for accumulating time errors and generating a feedback control signal, DCNTL. When a high-level period is relatively long, the charging time will be longer than the discharging time, as a result, the voltage of the charge pump will get high, and vice versa.

The feedback control signal, DCNTL, is for adjusting the relative delay time of INP and INN.

when t1>t2, namely, the high-level period is longer then the low-level period and, in turn, the output voltage of the charge pump, DCNTL, is getting high, prolong the delay time of INP and shorten the delay time of INN in order to decrease t1 and increase t2.

when t1<t2, namely, the low-level period is longer than the high-level period, in turn, the output voltage of the charge pump, DCNTL, is getting low, shorten the delay time of INP and prolong the delay time of INN in order to increase t1 and decrease t2.

whether t1>t2 or t1<t2, the final goal is to make t1 be equal to t2, that is, the rising edges or falling edges of the output signals INP and INN have the same time intervals.

Afterwards, output the well-adjusted delay time input signals of INP and INN into the synthesis output unit in order to generate an output signal with a good duty ratio.

The synthesis output unit synthesizes two rising or two falling signals with the same time intervals into just one path. Two divided-by-two circuits can be used to detect the rising edge or falling edge. By way of exclusive OR, synthesized output signals can be obtained.

By adjusting the weights of two paths of input signals of the charge pump, the following equations can be established:

$$t1*k1 = t2*k2$$

$$t1+t2 = T,$$

wherein said k1 and k2 represents the ratio of charging current to discharging current; if k1=k2=1, then t1=t2; k1 and k2 can be changed randomly in order to obtain a duty ratio that is equal to k2/k1; that is to say, t1/t2=k2/k1. Theoretically, k1 and k2 can be changed randomly.

Various implementations may include one or more of the following advantages. For example, the adjusting range of duty cycle has become much wider. Theoretically, any predetermined outputted duty cycle can be achieved. The implementation circuit is absolutely symmetrical, therefore, a duty cycle with high accuracy can be obtain through good matching and technique compensating.

DETAILED DESCRIPTION OF THE PREFERRED EMBODIMENT

Example I

Figure 1:
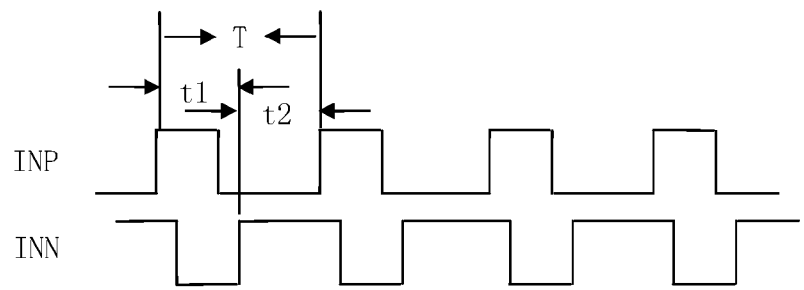
FIG. 1 illustrates a schematic diagram of the differential signals.
Figure 2:
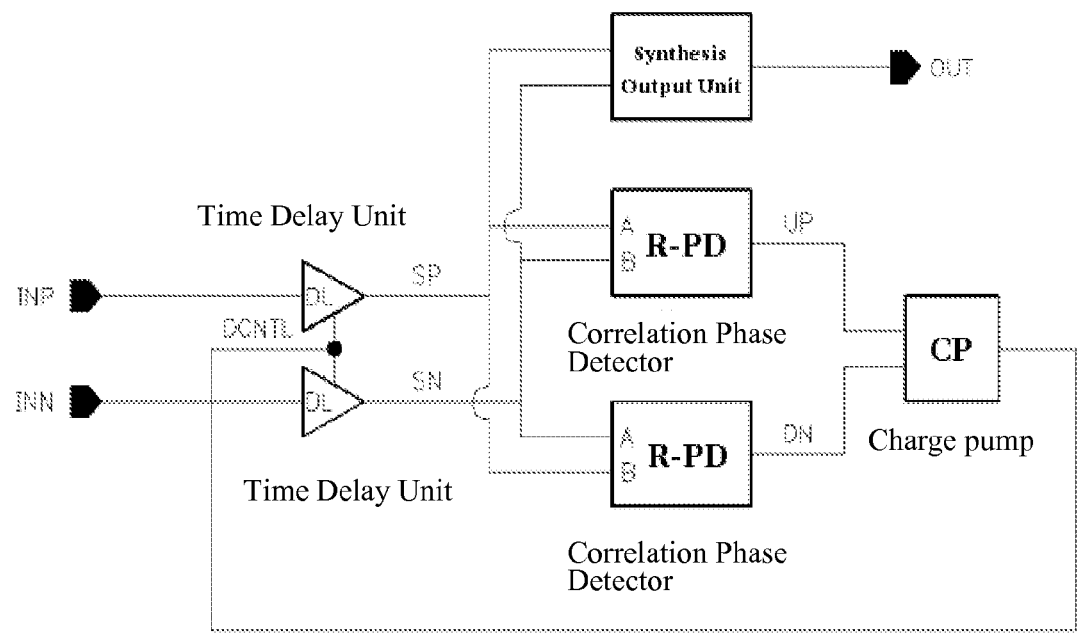
FIG. 2 illustrates a structural diagram of the present invention.

Referring to FIG. 1 and FIG. 2, a duty cycle correction method comprises detecting the relative delay time of inputted differential signals, INP and INN; obtaining the time delay t1 of INP relative to INN, and the delay time t2 of INN relative to INP; and making the sum of t1 and t2 be equal to the cycle T of the input signals, namely, t1+t2=T, wherein t1 and t2 corresponds to a high-level period and a low-level period respectively, and finally adjusting t1 and t2 till they are the same value, namely, the high-level period is the same time as the low-level period.

Since the cycle of input signals are relatively fixed, the changes of t1 and t2 are just the opposite. When the high-level period is shorter than the low-level period, INN needs to be delayed, that is, prolong the high-level period to t1 and make it be equal to t2 finally. Then, after subsequent output circuits, an output signal with the duty ratio of 1:1 can be obtained.

Referring to FIG. 2, a duty cycle correction circuit is designed for implementing the corresponding method described above. It comprises two time delay units, "DL", two relative phase detectors, "R-PD", a charge pump, "CP", and a synthesis output unit.

The input terminal of the two time delay units goes respectively to two differential signals, INP and INN.

Each of the two time delay units is connected with two relative phase detectors. The output of each of the two time delay units is connected reversely to the inputs of the two relative phase detectors, namely, while signal SP is connected to A terminal of first relative phase detector and B terminal of second relative phase detector, the other signal SN is connected to B terminal of the first relative phase detector and A terminal of the second relative phase detector.

The outputs of two relative phase detectors are connected to the two inputs of the charge pump, which, in turn, is connected to the time delay units with its output terminal, specifically, to the input port of the feedback control, "DCNTL", so as to form a loop. The two time delay units have reverse and symmetrical logic controls.

Also, the outputs of two time delay units are connected to the input of the synthesis output unit which generates output signals.

The feedback control signal DCNTL, acts for adjusting the relative delay time of INP and INN. When t1>t2, the high level is longer, correspondingly, the output voltage DCNTL of the charge pump goes up; then increase the delay time of INP and decrease the delay time of INN in order to shorten t1 and prolong t2 (because at the moment t1>t2), whereas if t1<t2, the low level is longer, accordingly, DCNTL goes down; then decrease the delay time of INP and increase the delay time of INN in order to prolong t1 and shorten t2. Finally, t1 and t2 will get to the same, namely, the rising edge or falling edge of the input signals, INP and INN, will get to the same intervals.

The synthesis output unit works for synthesizing the input signals with adjusted delay time of INP and INN and outputting a signal with a good duty ratio, which can be implemented by double edge triggered circuit.

The synthesis output unit synthesizes two-paths rising edges or two-paths falling edges into one path signal. Two divide-by-two frequency divider circuits can be used to have detected the rising edges and falling edges, after which the way of Exclusive OR can be used to synthesize output signals.

By adjusting the weights of two paths of input signals of the charge pump, the following equations can be established:

$$t1*k1 = t2*k2$$

$$T1+t2 = T,$$

wherein said k1 and k2 represents the ratio of charging current to discharging current; if k1=k2=1, then t1=t2; k1 and k2 can be changed randomly in order to obtain a duty ratio that is equal to k2/k1; that is to say, t1/t2=k2/k1. Theoretically, k1 and k2 can be changed randomly.

Example II

Figure 3:
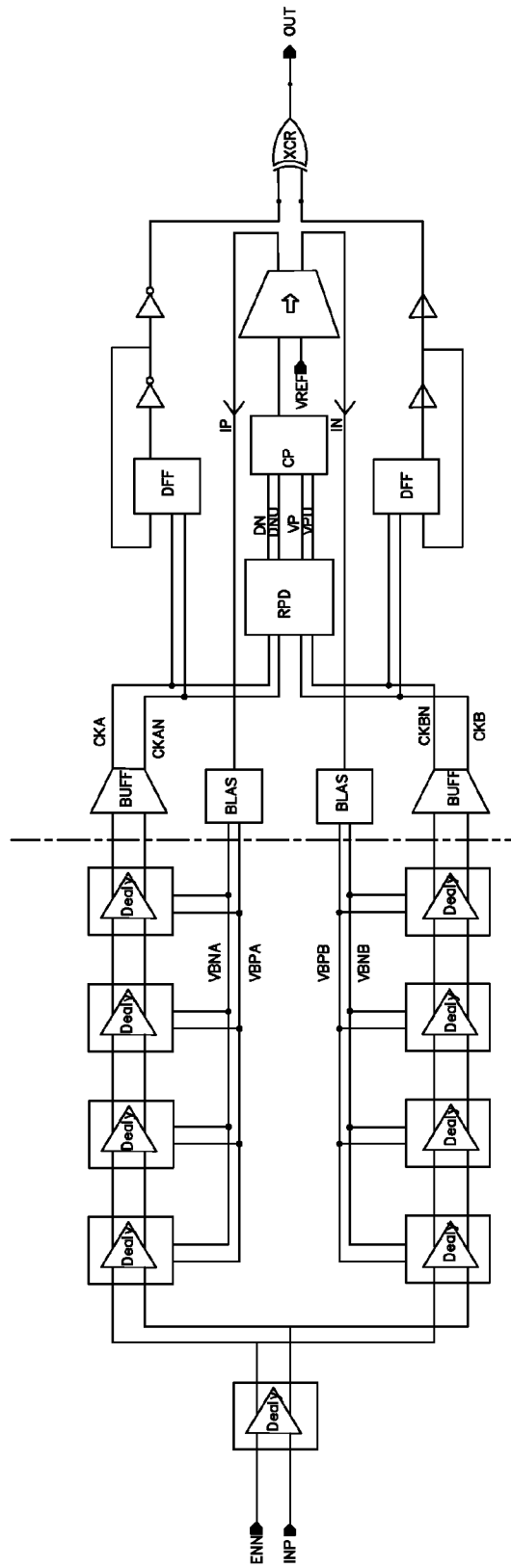
FIG. 3 illustrates a specific circuit diagram of one embodiment.
Figure 3A:
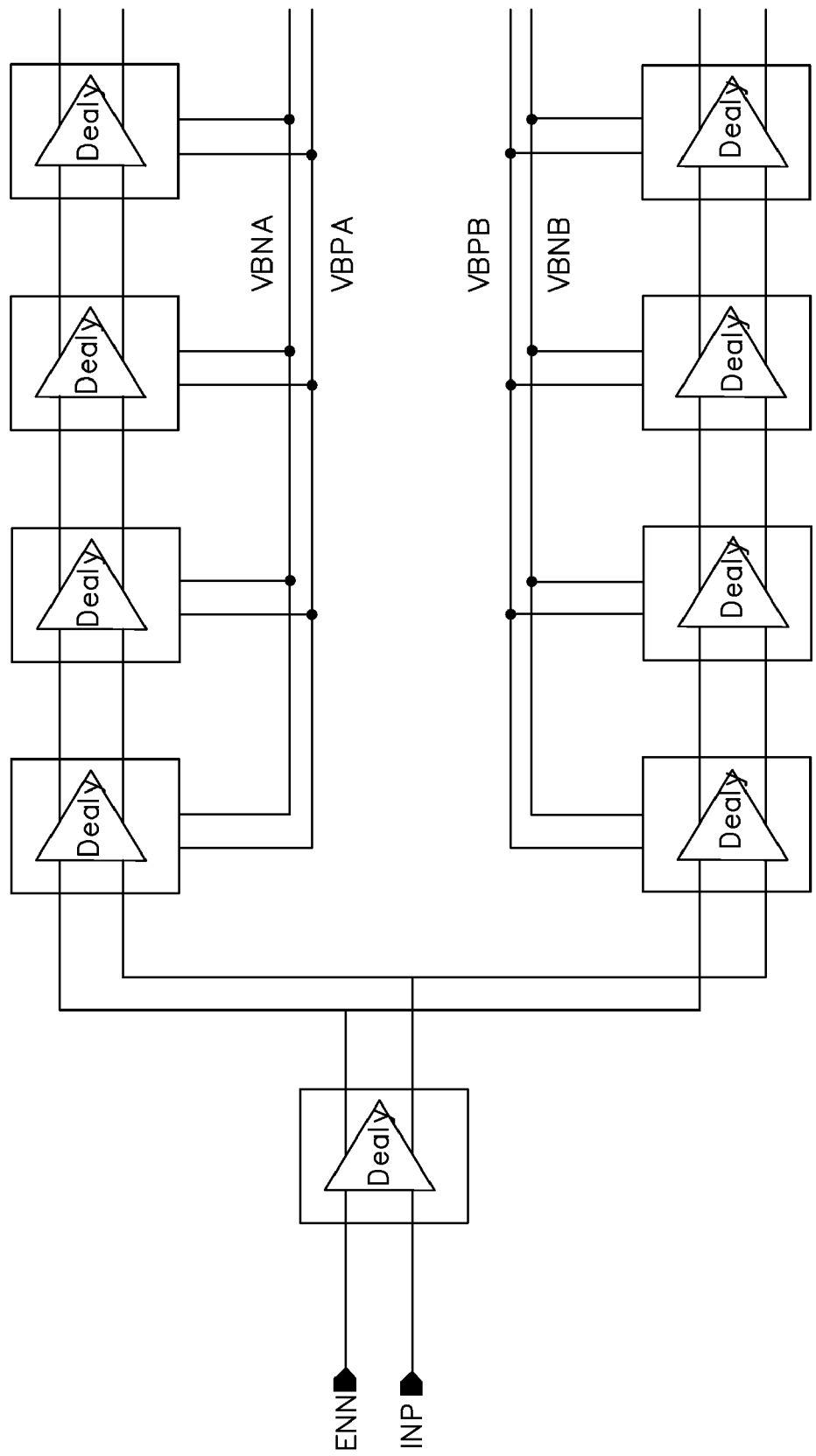
Figure 3B:
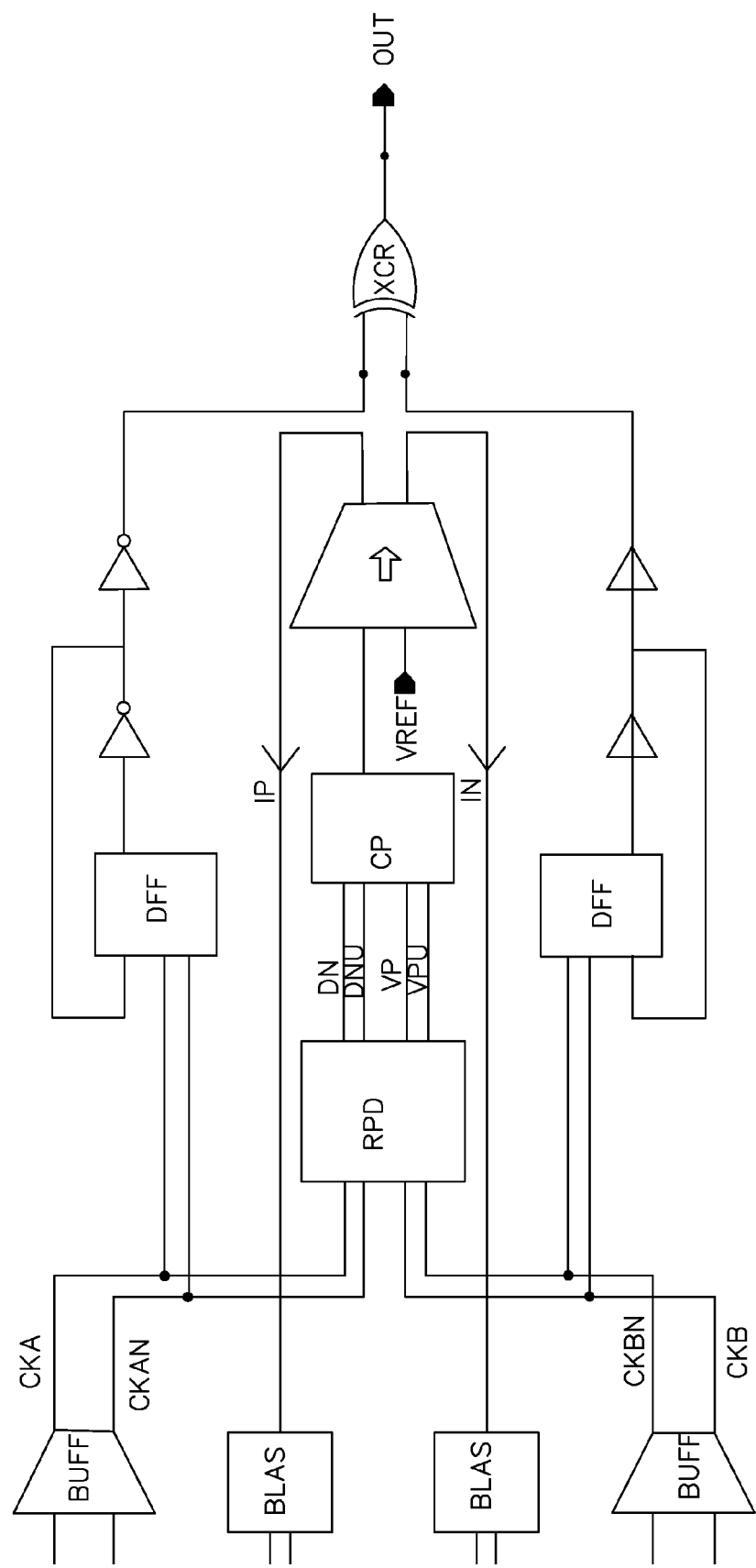

FIG. 3 shows the other embodiment. The synthesis output unit, with the other units same as the foregoing, comprises two divide-by-2 frequency dividers and a symmetrical Exclusive OR unit.

The charge pump has an equally-weighted configuration.

The final output wave has a duty ratio of 49.5%.

When the output signal has a duty ratio of 1:1, clock signals may be frequency divided by N. FIG. 3 shows an example of divided-by-four circuit, wherein the differential signals, INN and INP, are inputted directly to the two input terminals of the charge pump. Usually, frequency dividing circuits, especially multi-frequency dividing circuit, can be used to obtain signals with the duty ratio of almost exact 1:1.

The specific steps are as follows:

initializing the voltage of the charge pump;

inputting signals that have gone through frequency division to the charge pump circuit;

stopping inputting signals after an even number of cycles, 2*M (here M=100).

After having done the above steps, the output level is supposed to keep the same value. However, if the output level goes up, it is indicated that charging currents are too big, whereas if the output level goes down, it is indicated that charging currents are too little. By connecting in parallel two groups of smaller P type and N type transistor respectively, the charge pump will start to charge or discharge. After two cycles of charging and discharging, compare the voltage DCNTL of the charge pump with the initial level; if the DCNTL is higher than the initial level, then add more N type transistors; if the DCNTL is lower than the initial level, then add more P type transistors. Next, continuous scanning needs to be carried out in order to set up a critical status which will be the final adjusted result.

One skilled in the art will understand that the embodiments of the present invention as shown in the drawings and described above is exemplary only and not intended to be limiting.

It will thus be seen that the objects of the present invention have been fully and effectively accomplished. Its embodiments have been shown and described for the purpose of illustrating the functional and structural principles of the present invention and is subject to change without departure from such principles. Therefore, this invention includes all modifications encompassed within the spirit and scope of the following claims.

What is claimed is:

1. A duty cycle correction method, comprising the steps of:
   (A) detecting a first relative delay time of a first input signal relative to a second input signal and a second relative delay time of the second input signal relative to the first input signal, wherein the first input signal and the second input signal are a pair of differential signals, the first relative delay time and the second relative delay time respectively correspond to a high-level period of the first and second input signals and a low-level period of the first and second input signals, and a sum of the first relative delay time and the second relative delay time is equal to a cycle of the first input signal and the second input signal;
   (B) generating a feedback control signal by accumulating time errors of the high-level period of the first and second input signals, and the low-level period of the first and second input signals;
   (C) the feedback control signal adjusting the first relative delay time and the second relative delay time for equating the first relative delay time to the second relative delay time; and
   (D) after step (C), generating an output signal with a duty ratio of 1:1 by synthesizing two rising or falling signals with the same time intervals into just one path.

2. The duty cycle correction method, as recited in claim 1, wherein in step (A), the first relative delay time is detected by a first relative phase detector, and the second relative delay time is detected by a second relative phase detector.

3. The duty cycle correction method, as recited in claim 2, wherein in step (C), when the first relative delay time is longer than the second relative delay time, namely, the high-level period is longer than the low-level period and, in turn, a voltage of the feedback control signal goes up, then a delay time of the first input signal is prolonged and a delay time of the second input signal is shortened to decrease the first relative delay time and increase the second relative delay time till the first relative delay time is equal to the second relative delay time;
   when the second relative delay time is longer than the first relative delay time, namely, the low-level period is longer than the high-level period and, in turn, the voltage of the feedback control signal goes down, then the delay time of the first input signal is shortened and the delay time of the second input signal is prolonged to increase the first relative delay time and decrease the second relative delay time till the first relative delay time is equal to the second relative delay time.

4. The duty cycle correction method, as recited in claim 1, wherein in step (C), when the first relative delay time is longer than the second relative delay time, namely, the high-level period is longer than the low-level period and, in turn, a voltage of the feedback control signal goes up, then a delay time of the first input signal is prolonged and a delay time of the second input signal is shortened to decrease the first relative delay time and increase the second relative delay time till the first relative delay time is equal to the second relative delay time;
   when the second relative delay time is longer than the first relative delay time, namely, the low-level period is longer than the high-level period and, in turn, the voltage of the feedback control signal goes down, then the delay time of the first input signal is shortened and the delay time of the second input signal is prolonged to increase the first relative delay time and decrease the second relative delay time till the first relative delay time is equal to the second relative delay time.

5. A duty cycle correction circuit, comprising:
   a first time delay unit, wherein a first input signal is connected with an input end of the first time delay unit;
   a second time delay unit, wherein a second input signal is connected with an input end of the second time delay unit, and the first input signal and the second input signal are a pair of differential signals;
   a first relative phase detector, wherein an output end of the first time delay unit is connected with a first input end of the first relative phase detector, and an output end of the second time delay unit is connected with a second input end of the first relative phase detector;
   a second relative phase detector, wherein the output end of the first time delay unit is connected with a second input end of the second relative phase detector, and the output end of the second time delay unit is connected with a first input end of the second relative phase detector;
   a charge pump, wherein an output end of the first relative phase detector and an output end of the second relative phase detector are respectively connected with two input ends of the charge pump, and an output end of the charge pump is connected with a delay control input end of the first time delay unit and a delay control input end of the second time delay unit; and
   a synthesis output unit, wherein the output end of the first time delay unit and the output end of the second time delay unit are respectively connected with two input ends of the synthesis output unit, and an output end of the synthesis output unit outputs an output signal.

6. The duty cycle correction circuit, as recited in claim 5, wherein the first relative phase detector detects a first relative delay time of the first input signal relative to the second input signal, and the second relative phase detector detects a second relative delay time of the second input signal relative to the first input signal.

7. The duty cycle correction circuit, as recited in claim 6, wherein the output end of the charge pump outputs a feedback control signal for adjusting the first relative delay time of the first input signal relative to the second input signal and the second relative delay time of the second input signal relative to the first input signal, and a sum of the first relative delay time and the second relative delay time is equal to a cycle of the first input signal and the second input signal,
   when the first relative delay time is longer than the second relative delay time, namely, a high-level period is longer than a low-level period and, in turn, an output voltage of the charge pump goes up, then a delay time of the first input signal is prolonged and a delay time of the second input signal is shortened to decrease the first relative delay time and increase the second relative delay time till the first relative delay time is equal to the second relative delay time;
   when the second relative delay time is longer than the first relative delay time, namely, the low-level period is longer than the high-level period and, in turn, an output voltage of the charge pump goes down, then the delay time of the first input signal is shortened and the delay time of the second input signal is prolonged to increase the first relative delay time and decrease the second relative delay time till the first relative delay time is equal to the second relative delay time.

8. The duty cycle correction circuit, as recited in claim 7, wherein the synthesis output unit synthesizes two rising or falling signals with the same time intervals into just one path, that is, rising or falling edges are detected, and then the output signal is synthesized by way of exclusive OR.

9. The duty cycle correction circuit, as recited in claim 8, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents the first relative delay time of the first input signal relative to the second input signal, t2 represents the second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

10. The duty cycle correction circuit, as recited in claim 7, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents the first relative delay time of the first input signal relative to the second input signal, t2 represents the second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

11. The duty cycle correction circuit, as recited in claim 6, wherein the synthesis output unit synthesizes two rising or falling signals with the same time intervals into just one path, that is, rising or falling edges are detected, and then the output signal is synthesized by way of exclusive OR.

12. The duty cycle correction circuit, as recited in claim 11, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents a first relative delay time of the first input signal relative to the second input signal, t2 represents a second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

13. The duty cycle correction circuit, as recited in claim 6, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents a first relative delay time of the first input signal relative to the second input signal, t2 represents a second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

14. The duty cycle correction circuit, as recited in claim 5, wherein the output end of the charge pump outputs a feedback control signal for adjusting a first relative delay time of the first input signal relative to the second input signal and a second relative delay time of the second input signal relative to the first input signal, and a sum of the first relative delay time and the second relative delay time is equal to a cycle of the first input signal and the second input signal, when the first relative delay time is longer than the second relative delay time, namely, a high-level period is longer than a low-level period and, in turn, an output voltage of the charge pump goes up, then a delay time of the first input signal is prolonged and a delay time of the second input signal is shortened to decrease the first relative delay time and increase the second relative delay time till the first relative delay time is equal to the second relative delay time;

when the second relative delay time is longer than the first relative delay time, namely, the low-level period is longer than the high-level period and, in turn, an output voltage of the charge pump goes down, then the delay time of the first input signal is shortened and the delay time of the second input signal is prolonged to increase the first relative delay time and decrease the second relative delay time till the first relative delay time is equal to the second relative delay time.

15. The duty cycle correction circuit, as recited in claim 14, wherein the synthesis output unit synthesizes two rising or falling signals with the same time intervals into just one path, that is, rising or falling edges are detected, and then the output signal is synthesized by way of exclusive OR.

16. The duty cycle correction circuit, as recited in claim 15, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents the first relative delay time of the first input signal relative to the second input signal, t2 represents the second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

17. The duty cycle correction circuit, as recited in claim 14, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents the first relative delay time of the first input signal relative to the second input signal, t2 represents the second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

18. The duty cycle correction circuit, as recited in claim 5, wherein the synthesis output unit synthesizes two rising or falling signals with the same time intervals into just one path, that is, rising or falling edges are detected, and then the output signal is synthesized by way of exclusive OR.

19. The duty cycle correction circuit, as recited in claim 18, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents a first relative delay time of the first input signal relative to the second input signal, t2 represents a second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

20. The duty cycle correction circuit, as recited in claim 5, wherein weights of two input signals of the charge pump can be adjusted in order to obtain $t1 \times k1 = t2 \times k2$ and $t1+t2=T$, here k1 and k2 represents a ratio of charging current to discharging current of the charge pump, t1 represents a first relative delay time of the first input signal relative to the second input signal, t2 represents a second relative delay time of the second input signal relative to the first input signal, T is a cycle of the first and second input differential signals, wherein if $k1=k2=1$, then $t1=t2$; k1 and k2 are both variable, so a duty cycle can be expressed as $t1/t2=k2/k1$.

* * * * *